United States Patent [19]
Townsend

[11] Patent Number: 5,548,833
[45] Date of Patent: Aug. 20, 1996

[54] DATA INDEPENDENT AUTOMATIC GAIN CONTROL CIRCUIT FOR TELECOMMUNICATION APPLICATIONS

[75] Inventor: Jeffrey A. Townsend, North Chelmsford, Mass.

[73] Assignee: TranSwitch Corporation, Shelton, Conn.

[21] Appl. No.: 253,378

[22] Filed: Jun. 3, 1994

[51] Int. Cl.⁶ ............................... H04B 1/06; H03G 3/20
[52] U.S. Cl. .................................. 455/234.1; 455/246.1; 330/138; 330/280
[58] Field of Search ........................... 455/234.1, 241.1, 455/241.2, 243.1, 243.2, 245.2, 246.1, 247.1, 251.1, 252.1, 253.1, 253.2; 330/280, 138; 375/345

[56] References Cited

U.S. PATENT DOCUMENTS

| | | | |
|---|---|---|---|
| 3,904,971 | 9/1975 | Delagrange | 330/280 |
| 4,224,578 | 9/1980 | Bernitt | 330/280 |

FOREIGN PATENT DOCUMENTS

| | | | |
|---|---|---|---|
| 0037449 | 3/1979 | Japan | 330/280 |

Primary Examiner—Reinhard J. Eisenzopf
Assistant Examiner—Thanh Le
Attorney, Agent, or Firm—David P. Gordon

[57] ABSTRACT

A data independent AGC control circuit for telecommunication applications is provided and includes an AGC amplifier, a fixed gain amplifier, a capacitor, and first, second, and third control circuits. The AGC amplifier has a data input, a control input, and a data output. The capacitor is coupled to the control input, and the charge on the capacitor effectively controls the gain of the AGC amplifier. The first control circuit is coupled to the data output of the fixed gain amplifier and to the capacitor and increases the stored charge on the capacitor when the data output exceeds a desired peak voltage level. The second control circuit is similarly coupled between the data output of the fixed gain amplifier and the capacitor, and decreases the stored charge on the capacitor when the data output exceeds a threshold voltage (typically ½ the desired peak voltage level). The third control circuit is coupled to the second control circuit and to the capacitor, and decreases the charge on the capacitor after the data output falls below the threshold voltage for a predetermined length of time. With the provided circuit, data values of zero will not trigger either the first or second control circuit, and the capacitor voltage and hence control voltage to the AGC amplifier will not change.

21 Claims, 8 Drawing Sheets

DATA INDEPENDENT AUTOMATIC GAIN CONTROL CIRCUIT FOR TELECOMMUNICATION APPLICATIONS

BACKGROUND OF THE INVENTION

1. Field of the Invention

The present invention relates to automatic gain control (AGC) circuits. More particularly, the present invention relates to low jitter AGC circuits for telecommunication applications which are embodied in integrated circuits.

2. State of the Art

One of the requirements for telecommunication circuits is an AGC circuit which restores the amplitude of pulses which have been transmitted over a lossy medium such as a coaxial line, a twisted pair, or an optical fiber line. The data transmitted over these lines is usually of the form of an encoded bit stream which contains a limited number of zeros to provide energy for clock extraction from the input data spectrum.

Figure 1:
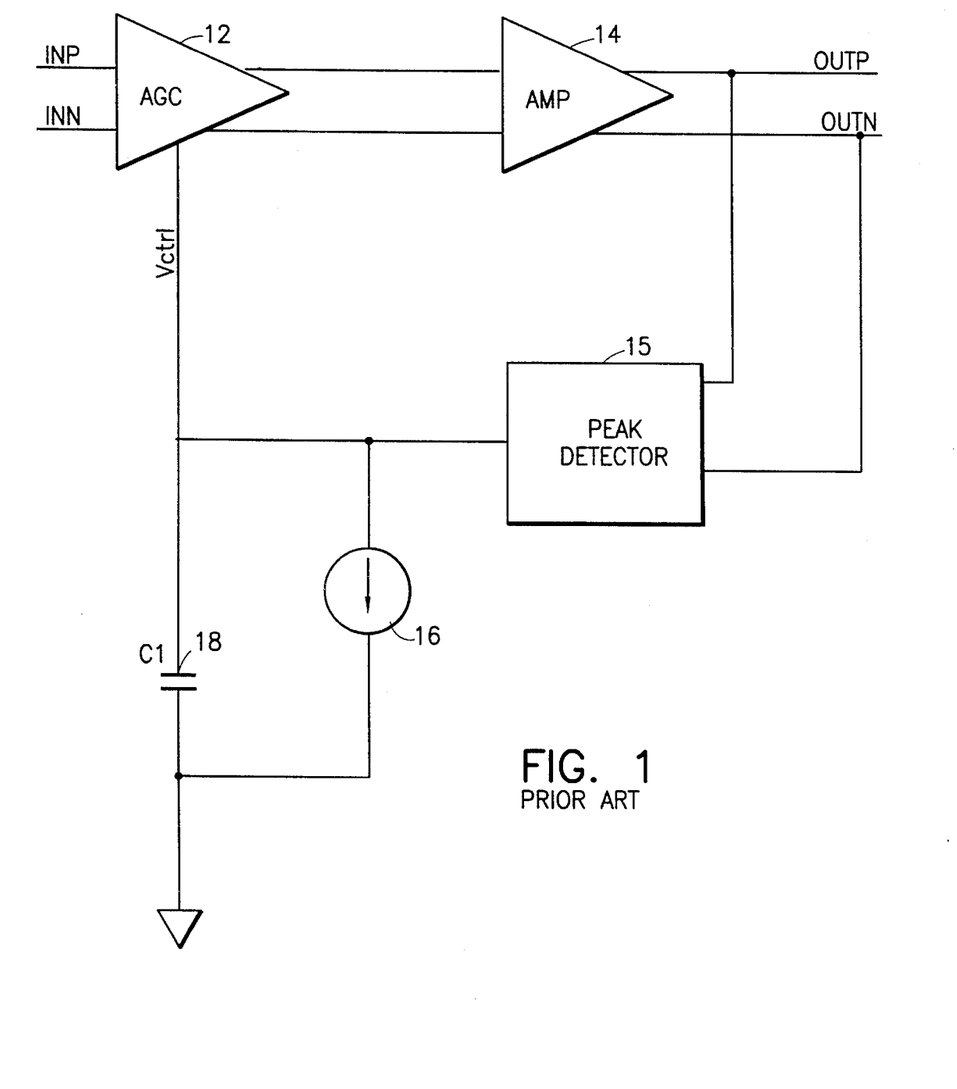
FIG. 1 is a schematic diagram of prior art AGC control circuit.

A block diagram of a prior art AGC control loop with differential inputs and outputs is seen in FIG. 1. The AGC circuit 10 includes two differential amplifiers 12, 14, a peak detector 15, a current source 16, and a capacitor 18. The first differential amplifier 12 receives the differential input signal INP, INN, and amplifies the signal according to a feedback control signal Vctrl. The differential output of amplifier 12 is fed to a fixed gain differential amplifier 14 which further boosts the signal and provides a differential output signal OUTP, OUTN. The differential output signals are fed back to the peak detector 15 which compares the level of the signals to a reference voltage and generates correction pulses. The correction pulses generated by the peak detector 15 are then fed to the capacitor 18 which is coupled between a ground voltage and the control input of the differential amplifier 12, thereby closing the feedback loop. The capacitor 18 stores the charge, and the voltage on the capacitor built up due to the stored charge effectively controls the amplification of amplifier 12. In order to permit the AGC loop to respond to changes in the input signal level, a discharge mechanism in the form of the current source 16 is provided between the the plates of capacitor 18.

With the prior art AGC circuit 10 as shown in FIG. 1, any non-DC signals which appear at the capacitor output (i.e., Vctrl) will amplitude modulate the output signals (OUTP, OUTN), and will cause jitter on the recovered data signal. Also, with the prior art AGC circuit 10, the spectral content of the signal appearing on the control voltage will be directly related to the number of zeros in the data stream. The waveform on the control voltage will appear as a sawtooth wave with a period T defined approximately according to:

T=(1+#of zeros)R where R is the data repetition rate. In other words, where the input data signal includes many zeros, the charge on capacitor 18 will drain, and will force Vcrtl low. As a result, the gain of AGC amplifier 12 will be substantially boosted, which will in turn gradually build up charge on the capacitor 18 and bring the gain of the signal back to desired levels. In the interim, however, undesirably large swings in the voltage of the output signals OUTP and OUTN will occur.

Those skilled in the art will appreciate that the control voltage is ideally a DC signal, since any AC signals which are present will cause amplitude modulation of the output signal. To simplify integration of the charge storage element, the frequency of the AC signals appearing on the control voltage should be as high as possible relative to the data rate. However, with the prior art AGC circuits, the minimum period of the AC signals will always be less than the data rate since there will always be zeros in the data stream. While it is possible to filter these pulses with an additional low pass filter, the time constant of the filter (which would typically require a large capacitor) would make integration of the circuit difficult and/or expensive in terms of IC chip area.

SUMMARY OF THE INVENTION

It is therefore an object of the invention to provide an AGC circuit where the gain control is independent of the number of zeros occurring in the data stream input to the AGC.

It is a further object of the invention to provide a low jitter AGC circuit for telecommunication signal applications.

It is another object of the invention to provide a low jitter AGC circuit which is easily incorporated into an integrated circuit.

It is an additional object of the invention to provide an AGC circuit where the gain control is effectively a DC signal.

In accord with the objects of the invention, a data independent AGC control circuit for telecommunication applications is provided and generally comprises an AGC amplifier, a charge storage means, and first, second, and third control circuits. The AGC amplifier has at least one data input, at least one control input, and at least one data output. The charge storage means, which is typically a capacitor, is coupled to the control input of the AGC amplifier, and the charge on the capacitor effectively controls the gain of the AGC amplifier. The first control circuit is coupled to the data output of the AGC and to the capacitor and increases the stored charge on the capacitor when the data output exceeds a desired peak voltage level. The second control circuit is similarly coupled between the data output of the AGC and the capacitor, and decreases the stored charge on the capacitor when the data output exceeds a threshold voltage above ground, but below the desired peak voltage level. The third control circuit is preferably coupled to the second control circuit and to the capacitor, and decreases the charge on the capacitor after the data output falls below the threshold voltage for a predetermined length of time.

According to a preferred aspect of the invention, the AGC circuit further includes a fixed gain amplifier which is coupled to the output of the AGC amplifier. The first control circuit includes a first comparator, a first transistor which is coupled to the capacitor, and a first current source coupled to the first transistor. The inputs of the comparator of the first control circuit are received from the data output of the fixed gain amplifier and a voltage source set at the desired peak voltage output of the circuit, and the first comparator turns on the first transistor and increases the charge on the capacitor when the data output exceeds the desired peak voltage. The amount of charge added to the capacitor depends on the length of time that the output voltage exceeds the desired peak voltage. The second control circuit also includes a (second) comparator, a (second) transistor coupled to the capacitor, and a (second) current source coupled to the second transistor, and further includes a one-shot circuit. The inputs of the second comparator of the second control circuit are received from the data output of the fixed gain amplifier and a voltage source preferably set at a threshold of one-half the desired peak voltage output of the circuit. The output of the second comparator is fed to the one-shot circuit which turns on the second transistor for a predetermined length of time and decreases the charge on the capacitor when the data output exceeds the threshold value. The amount of charge drained from the capacitor is fixed by the one-shot circuit and is preferably approximately equal to the amount of charge added by the first control circuit when the output voltage just exceeds the desired peak output voltage. In other words, in equilibrium, the actual output voltage will dither very closely around the desired output voltage, as the control signal to the AGC amplifier will be almost constant. It should be appreciated that with the provided first and second control circuits, missing pulses will cause no change to the AGC control as neither the first or second control circuit will be triggered.

The third control circuit is essentially a reset circuit which is triggered if the output voltage falls, for a predetermined length of time, below the threshold which triggers the second control circuit. The third control circuit preferably includes third and fourth transistors, a second capacitor, and a third current source. The second capacitor is coupled between the third current source and ground. The third transistor is coupled in parallel with the second capacitor and is controlled by the output of the second comparator of the second control circuit. In other words, when the comparator of the second control circuit provides a positive output, the second capacitor of the third control circuit is drained. However, if the comparator of the second control circuit does not provide a positive output (indicating that the voltage of the output of the AGC circuit is below ½ of the desired peak value), the voltage on the second capacitor increases. If the undesired condition remains beyond an ordinary amount of time (i.e., the maximum length string of zeros expected in the data stream), the voltage on the second capacitor will reach a value which turns on the fourth transistor. The fourth transistor is coupled between the first capacitor and the second current source, and when turned on effectively drains current off the first capacitor; thereby causing the AGC amplifier to boost its output.

Additional objects and advantages of the invention will become apparent to those skilled in the art upon reference to the detailed description taken in conjunction with the provided figures.

DETAILED DESCRIPTION OF THE PREFERRED EMBODIMENT

Figure 2:
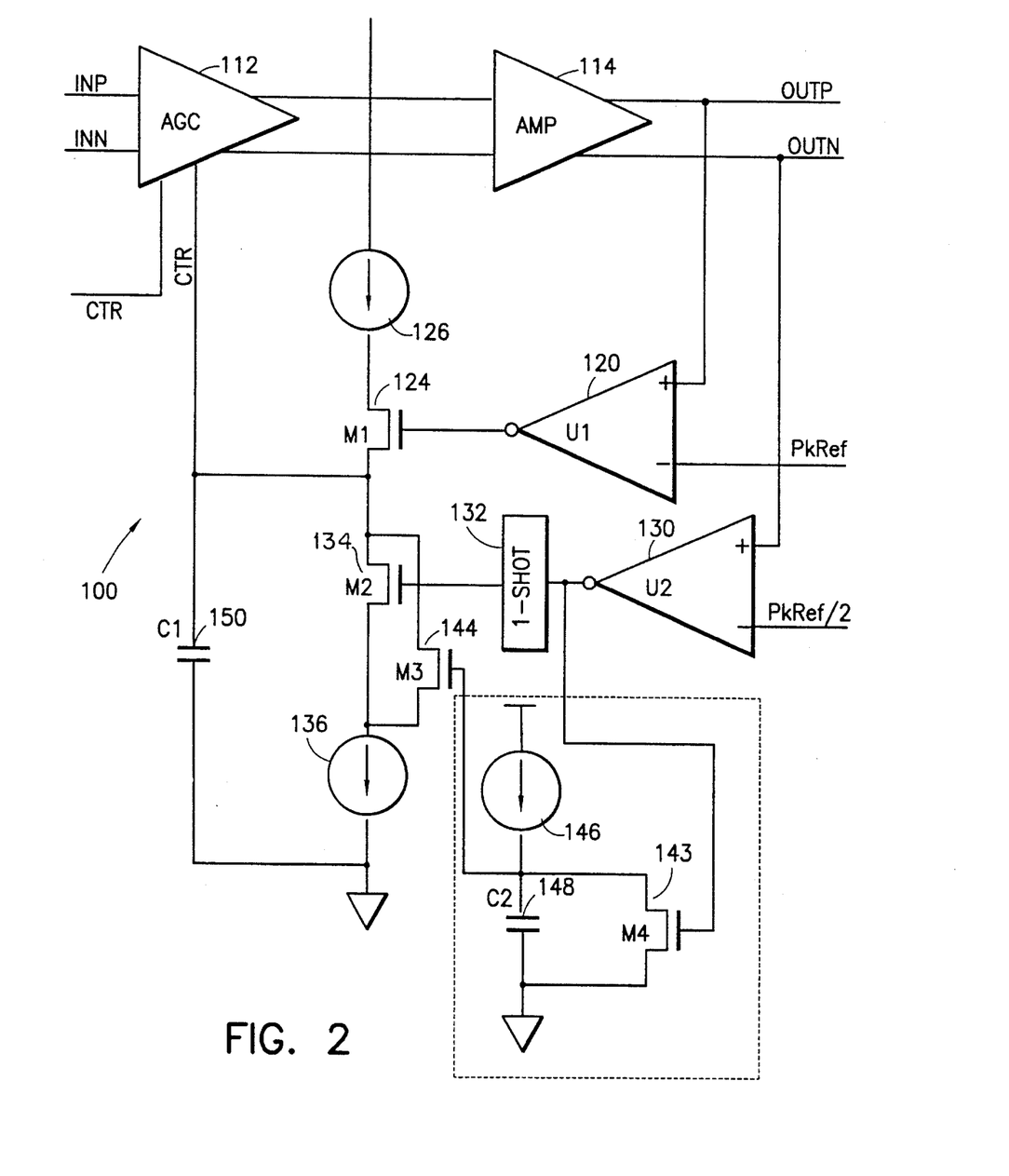
FIG. 2 is a schematic diagram of the data independent AGC control circuit of the invention.

The preferred data independent AGC control circuit 100 of the invention is seen in FIG. 2. The preferred circuit 100 essentially includes two differential amplifiers 112, 114, two comparators 120, 130, a one-shot 132, four MOSFET transistors 124, 134, 143, 144, three current sources 126, 136, 146, and two capacitors 148, 150. The feed-through circuit of the AGC control circuit 100 includes the differential amplifiers 112 and 114. The feed-back circuit of the AGC control circuit 100 includes three control circuits and the capacitor 150. The first control circuit includes comparator 120, transistor 124, and current source 126. The second control circuit includes comparator 130, the one-shot 132, transistor 134, and current source 136. The third control circuit includes transistors 143 and 144, current source 146, and capacitor 148.

As shown, the AGC control circuit 100 is for differential input data signals INP, INN, and provides output data signals OUTP, OUTN. The differential input signals are received by the AGC differential amplifier 112 having differential controls ctrlp, ctrln which control the gain of the amplifier. As discussed hereinafter, the control ctrln is used as a feedback control for the circuit 100. The AGC differential amplifier 112 amplifies the input signals and preferably provides the amplified signals to a second differential amplifier 114 which has a fixed gain. The output from the second differential amplifier 114 is taken as the output data signals OUTP, OUTN.

In the preferred embodiment of the invention, the differential output data signals OUTP and OUTN are respectively used by the first and second control circuits. Thus, output signal OUTP is provided to the positive input of comparator 120, while a desired peak output voltage level is provided as a reference voltage to the negative input of comparator 120. When the voltage of data signal OUTP exceeds the reference voltage (i.e., the data signal voltage level is higher than desired), comparator 120 is turned on. Since the output of comparator 120 is coupled to the gate of transistor 124, when comparator 120 is turned on, transistor 124 is turned on. When transistor 124 is on, it conducts current provided to the source of transistor 124 by current source 126 to one plate of capacitor 150 which is coupled to the drain of transistor 124. This causes the voltage at capacitor 150 to increase, thereby increasing the ctrln control voltage to the AGC amplifier 112. When the ctrln control voltage increases, the gain of AGC amplifier 112 is reduced. As a result, the feedback loop incorporating the first control circuit reduces the output data signal voltage level as desired. It will be appreciated by those skilled in the art, that the more that the data signal OUTP exceeds the reference voltage, the longer comparator 120 will be on, and the quicker the voltage on capacitor 150 will ramp up. Thus, the correction of the voltage level will occur quickly.

As mentioned above, the OUTN data signal is provided to the second control circuit. In particular, the OUTN data signal is provided to the positive input of comparator 130, while a threshold voltage signal, preferably chosen to be half of the desired peak output voltage (PkRef/2) is provided to the negative input of comparator 130. Thus, whenever the voltage of the data output signal exceeds half of the desired peak voltage value, comparator 130 will turn on. Whenever comparator 130 turns on, one-shot circuit 132 causes a short pulse to be provided to the gate of transistor 134. During the short pulse, transistor 134 is turned on. Due to the provision of the current source 136 at the drain of transistor 134, when transistor 134 is on, current is drained from capacitor 150 which is coupled to the source of transistor 134 through transistor 134 to ground. This causes the voltage at capacitor 150 to decrease, thereby decreasing the ctrln control voltage to the AGC amplifier 112. When the ctrln control voltage decreases, the gain of AGC amplifier 112 is increased. As a result, the feedback loop incorporating the second control circuit increases the output data signal voltage level as desired. It will be appreciated by those skilled in the art, that the length of time the data signal OUTN exceeds the threshold voltage PkRef/2 does not impact the rate at which current is drained off of the capacitor 150 due to the one-shot circuit 132. In fact, the length of time the one-shot provides a high output is preferably chosen so that the amount of charge drained from the capacitor is preferably approximately equal to the amount of charge added by the first control circuit when the output voltage just exceeds the desired peak output voltage. Thus, in equilibrium, capacitor 150 is alternately charged and discharged based on the pulses from comparators 120 and 130. If the amplitude of the output signals OUTP, OUTN increases, the first control circuit will decrease the AGC gain. On the other hand, if the amplitude is between PkRef and PkRef/2, the first control circuit will not charge capacitor 150, while the second control circuit will discharge capacitor 150 and force the AGC gain to increase. Missing pulses will desirably cause no change to the AGC control voltages since neither comparator will be turned on. On the other hand, pulses below the threshold voltage (PkRef/2) also will not cause the gain to increase, as neither comparator 120 or 130 will turn on.

In order to guarantee that the gain of the AGC circuit will increase when the amplitudes of the output pulses are below the threshold of comparator 130, a third "reset" control circuit is preferably provided. As stated above, the third control circuit includes two transistors 143 and 144, a current source 146, and a capacitor 148. Transistor 143 has its gate coupled to the output of comparator 130, and its drain and source coupled in parallel with capacitor 148 between current source 146 and ground. The source of transistor 143 is also coupled to the gate of transistor 144 which has its source and drain coupled in parallel with the source and drain of transistor 134 of the second control circuit. With this arrangement, the third control circuit essentially provides a reset circuit which is triggered if the output voltage falls, for a predetermined length of time, below the threshold which triggers the second control circuit. In particular, when the comparator of the second control circuit provides a positive output (i.e., the output voltage is greater than the threshold), transistor 143 turns on and drains capacitor 148. As a result, transistor 144 is kept off and the third control circuit does not impact the gain of AGC circuit 100. On the other hand, if the comparator 130 of the second control circuit does not provide a positive output, transistor 143 is turned off, and current source 146 increases the charge on the capacitor 148. The parameters of capacitor 148 are chosen such that if comparator 130 stays off beyond an ordinary amount of time (i.e., the maximum length string of zeros expected in the data stream), the voltage on capacitor 148 will reach a value which turns on transistor 144. Since transistor 144 functions in the same manner as transistor 134, when transistor 144 is turned on, current is drained off of capacitor 150, thereby causing the AGC amplifier to boost its output. It should be appreciated that by providing capacitor 148 with the capacity to charge up slowly, during normal operation, the reset control circuit will not effect the gain of the system. In fact, a single pulse near the desired peak amplitude should be sufficient to keep transistor 143 on long enough so that all of the charge on capacitor 148 is drained.

With the provided data independent AGC circuit of the invention, the width of the pulses which charge and drain the feedback capacitor 150 can be set to be an order of magnitude shorter than the width of the data pulses. This allows a small easily integrated capacitor to be used without causing excessive amplitude modulation of the data pulses. If further filtering is desired, an additional low pass filter (not shown) can be provided at the output of the capacitor by providing a resistor (not shown) between the capacitor 150 and the input to the AGC 112, and another capacitor (not shown) between the resistor and ground.

Figure 3:
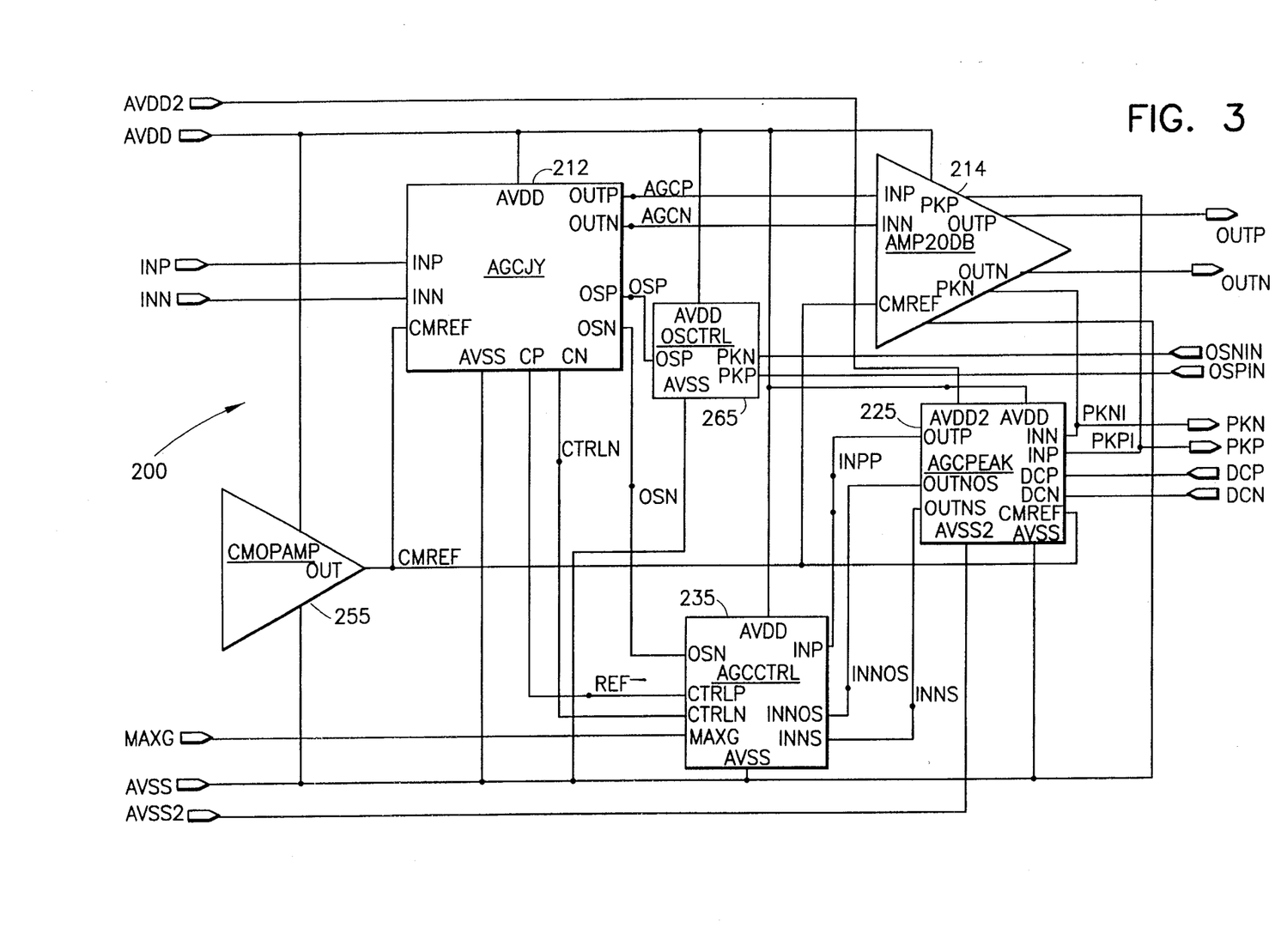
FIG. 3 is a block diagram of the preferred circuitry used to implement the schematic diagram of FIG. 2.
Figure 4:
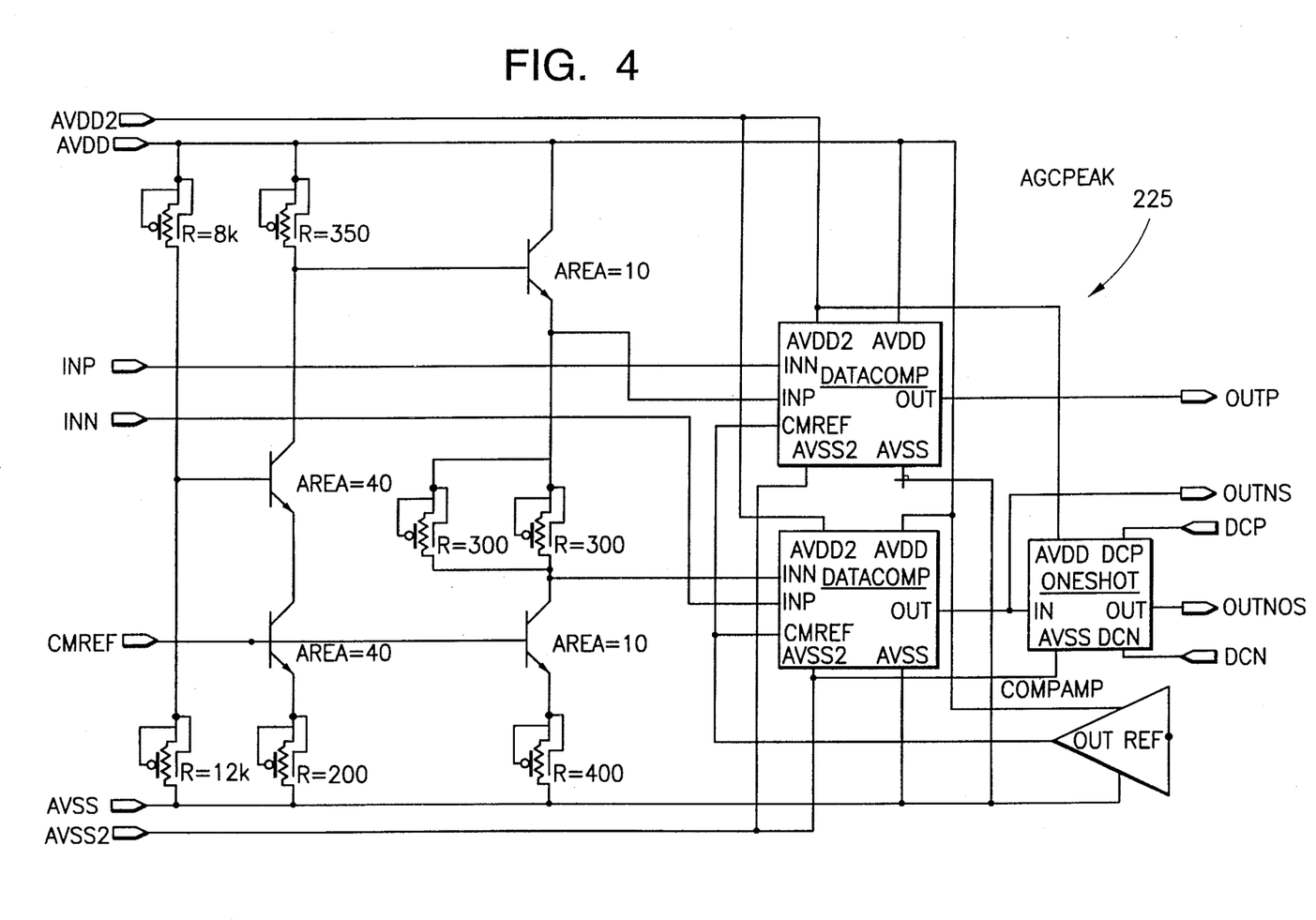
FIG. 4 is a part block, part circuit diagram of the automatic gain control peak block (agcpeak) of FIG. 3.

Turning to FIG. 3, a block diagram of the preferred data independent AGC circuit of the invention as implemented is seen. The implemented AGC circuit 200 basically includes an automatic gain control block (agcjy) 212, an amplifier (amp20db) 214, an automatic gain control peak block (agcpeak) 225, an automatic gain control (agcctrl) block 235, a bias circuit (cmopamp) 255, and an offset control block (osctrl) 265. As will be appreciated by those skilled in the art, the automatic gain controlblock 212 of FIG. 3 corresponds to the AGC amplifier 112 of FIG. 2, and the amplifier 214 of FIG. 2 corresponds to the amplifier 114 of FIG. 2. The agcpeak block 225 of FIG. 3 corresponds to comparators 120 and 130 of FIG. 2, as well as to the one shot 132 of FIG. 2. Circuit details of the agcpeak block 225 are see in FIG. 4 which shows two comparators (datacomp) 402a, 402b as well as a one-shot block (one-shot) 404, which are all standard circuits. It should be appreciated that resistive elements in the agcpeak block 225 are implemented in transistors 421–427 as seen in FIG. 4. Additional transistors 441–444 are also seen.

Figure 5:
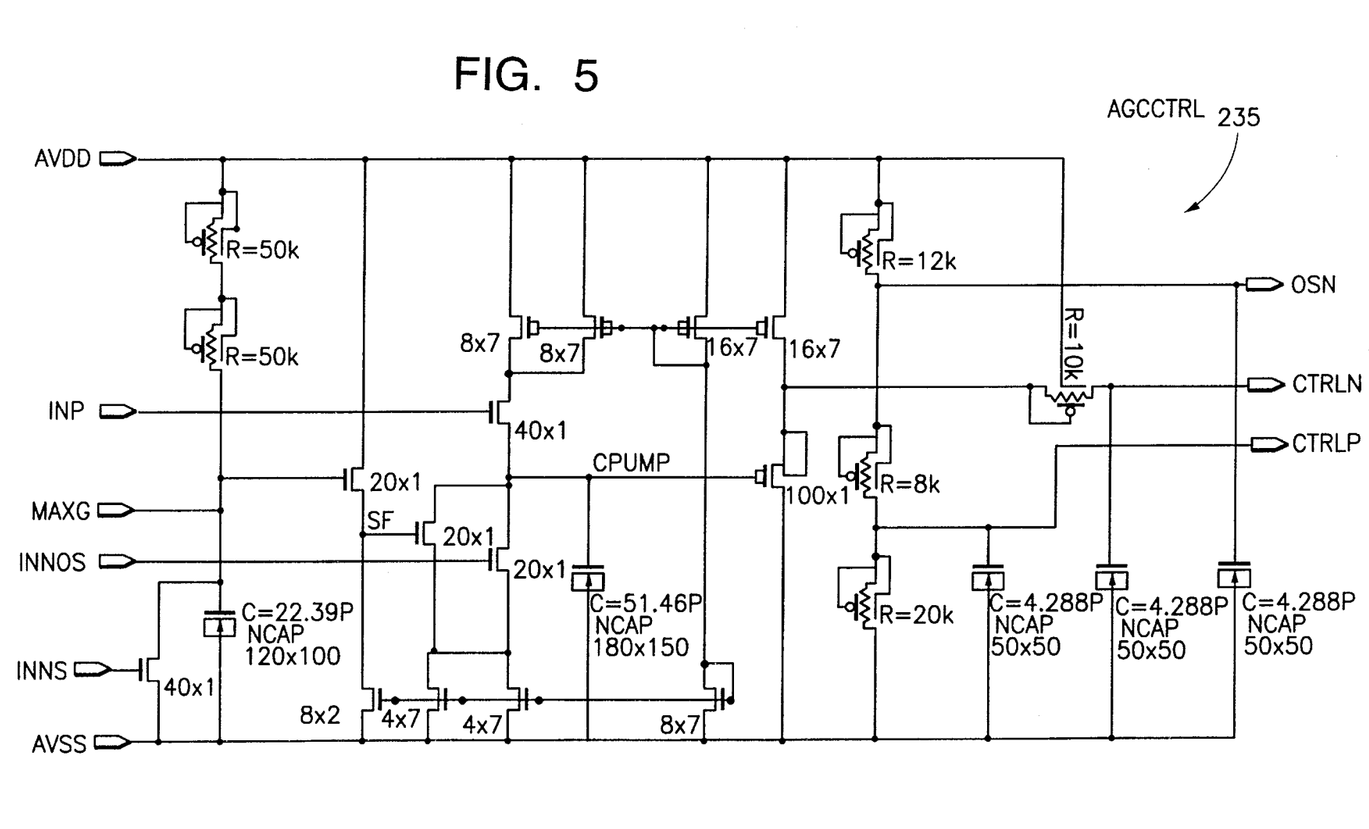
FIG. 5 is a circuit diagram of the automatic control block (agcctrl) of FIG. 3.

The agcctrl block 235 includes elements of at least the second and third control circuits of FIG. 2, including any capacitive elements. Circuit details of the agcctrl block 235 are see in FIG. 5 where it is seen that capacitors and resistors are preferably implemented in transistors 501–505 and 511–516. Additional transistors 521–534 are also provided.

Figure 6:
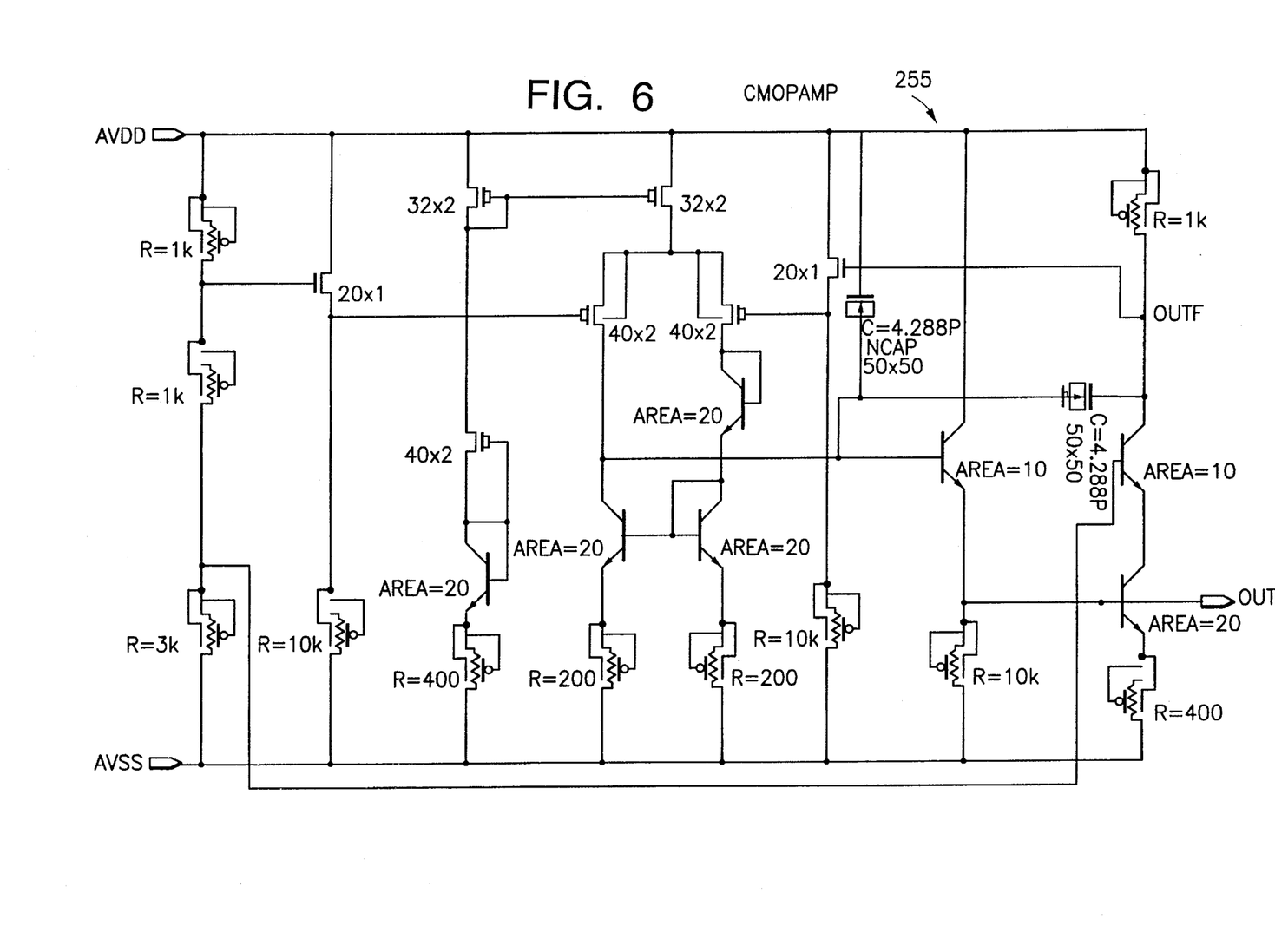
FIG. 6 is a circuit diagram of the bias circuit (cmopamp) of FIG. 3.
Figure 7:
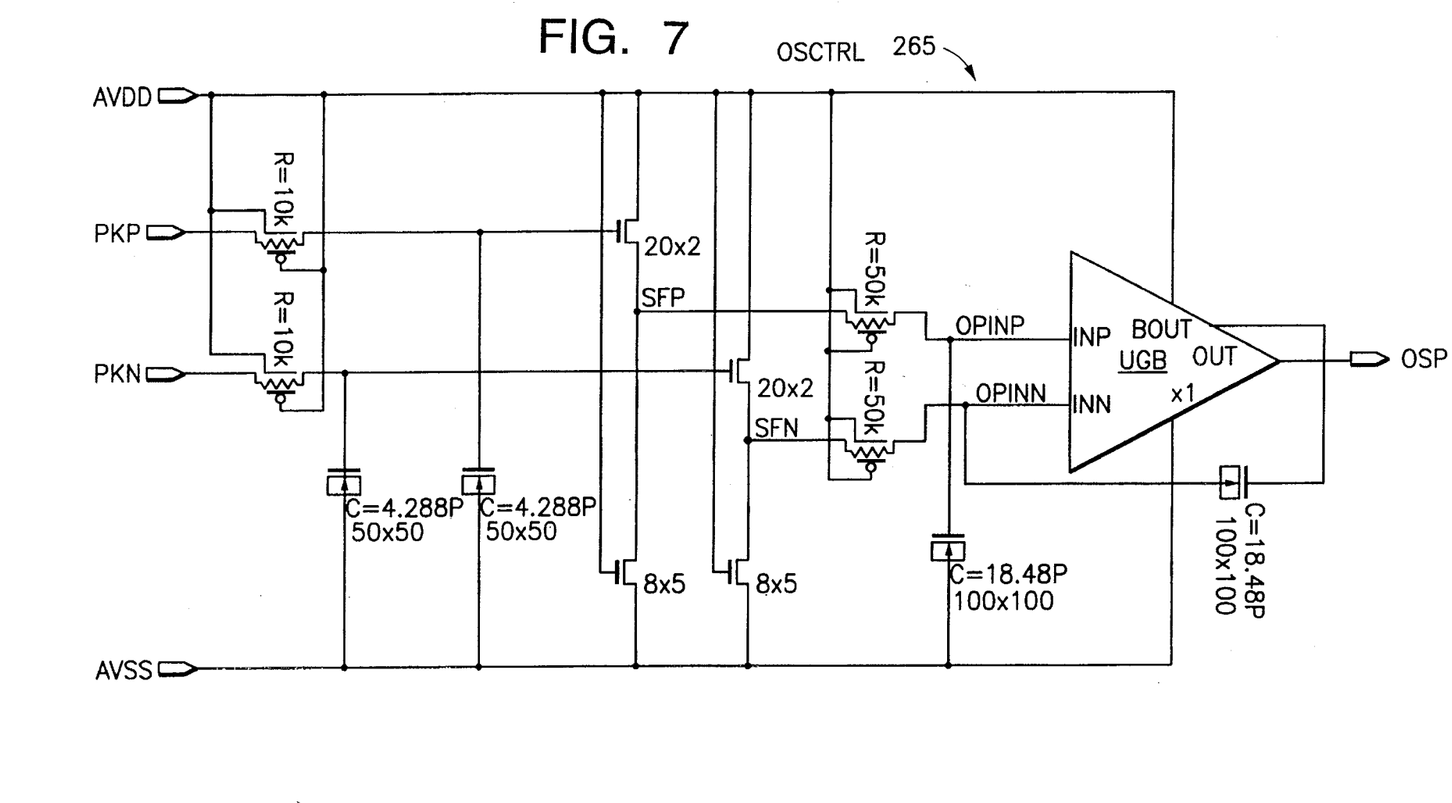
FIG. 7 is a part block, part circuit diagram of the offset control block (osctrl) of FIG. 3.
Figure 8:
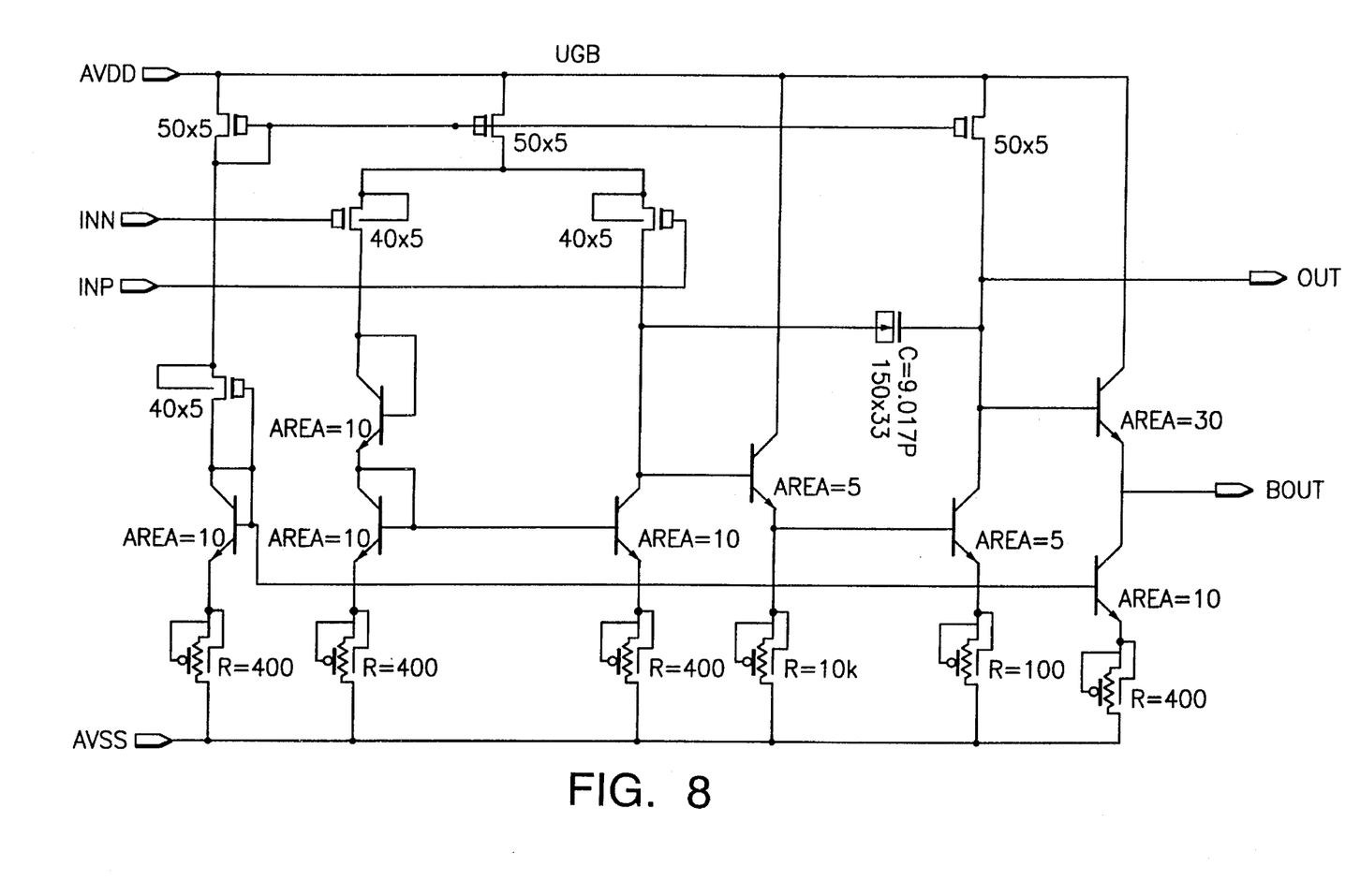
FIG. 8 is a circuit diagram of a block of FIG. 3.

The two elements of the AGC circuit 200 of FIG. 3 not specifically shown in FIG. 2 are the bias circuit 255 and the offset control block 265. The bias circuit 255 is provided in order to set the current in the circuit, and details thereof are see in FIG. 6 where transistors 601–611 are provided as resistive elements, transistors 621 and 622 are provided as capacitive elements, and additional transistors 631–637 and 641–647 are provided. The offset control block 265 is provided in order to limit the effect of element mismatch in the other blocks, and details thereof are see in FIG. 7 where transistors 701–704 are resistive elements, transistors 711–714 are capacitive elements, and additional transistors 721–723 and a comparator block 750 are provided. Element 750 of FIG. 7 is further detailed in FIG. 8 where transistors 801–806 are resistive elements, transistor 811 is a capacitive element, and additional transistors 821–826, and 831–838 are provided.

There has been described and illustrated herein a data independent AGC control circuit which is particularly useful in telecommunication applications. While a particular embodiment has been described herein, it is not intended that the invention be limited exactly thereto, as it is intended that the invention be broad in scope as the art will allow. Thus, while a circuit was provided for a differential bipolar signal, it will be appreciated that a similar circuit which simply ties the positive inputs of comparators together could be utilized for single ended signals. Also, while a preferred threshold voltage for the second control circuit was described, it will be appreciated that any threshold voltage between the peak reference voltage and ground could be utilized. In fact, by choosing an extremely low threshold voltage which is just high enough to discriminate against a zero, it might be possible to eliminate the reset circuit.

Further, it will be appreciated that while certain circuitry was described as being preferred for the control circuits, other circuitry could be utilized. For example, instead of MOSFET transistors, other transistors such as bipolar transistors and associated circuitry or combinations of bipolar and MOSFET transistors (as seen in FIGS. 4–8 could be utilized. Likewise, the comparators, one-shot, current sources, etc. could be replaced with other circuitry which performs a similar function, and the detailed circuitry provided in FIGS. 4–8 could be replaced with other suitable circuitry. Further, it will be appreciated that while distinct control circuits are described, and distinct blocks and circuitry are described, the control circuits and blocks and circuitry are typically implemented as an integrated circuit, although they could be implemented as discrete components. Therefore, it should be apparent to those skilled in the art that additional changes and modifications may be made to the invention as described in the specification without departing from the spirit and scope of the invention.

I claim:

1. A data independent automatic gain control apparatus which amplifies an incoming data signal and provides an amplified output signal, comprising:

a) a first amplifier means with an adjustable gain and having a data input which receives said incoming data signal, a control input which controls said adjustable gain of said first amplifier means, and a data output;

b) charge storage means coupled to said control input of said first amplifier means for supplying a control voltage to said control input;

c) a first control circuit means coupled to said data output of said first amplifier means and to said charge storage means, said first control circuit means for changing the charge on said charge storage means in a first direction when a voltage of said amplified output signal exceeds a desired peak voltage level;

d) a second control circuit means coupled to said data output of said first amplifier means and to said charge storage means, said second control circuit means for changing the charge on said charge storage means in a second direction when said voltage of said amplified output signal exceeds a predetermined threshold voltage level, said predetermined threshold voltage level being set lower than said desired peak voltage level and higher than ground; and e) a third control circuit means coupled to said second control circuit means and to said charge storage means, said third control circuit means for changing the charge on said charge storage means in said second direction when said voltage of said amplified output signal falls below said threshold voltage level for a predetermined length of time, wherein said voltage of said amplified output signal of said automatic gain control apparatus is substantially independent of the values of said incoming data signal.

2. An apparatus according to claim 1, further comprising:

a second amplifier means having fixed gain, said second amplifier means having a data input which receives said data output of said first amplifier means, and an output which relates to said amplified output signal, wherein said first control circuit means and said second control circuit means are coupled to said data output of said first amplifier means via said second amplifier means.

3. An apparatus according to claim 2, wherein:

said first control circuit means includes a first comparator means which compares said amplified output signal and said desired peak voltage level, a first transistor which is coupled to said first comparator means and to said charge storage means, and a first current source means coupled to said first transistor, wherein said first transistor and said first current source means cause the charge on said charge storage means to change in said first direction when said first comparator means determines that said amplified output signal exceeds said desired peak voltage level, and said second control circuit means comprises a second comparator means which compares said amplified output signal and said threshold voltage level, a second transistor which is coupled to said second comparator means and to said charge storage means, and a second current source means coupled to said second transistor, wherein said second transistor and second current source means cause the charge on said charge storage means to change in said second direction when said second comparator means determines that said amplified output signal exceeds said threshold voltage level.

4. An apparatus according to claim 3, wherein:

said second control circuit means further comprises a one-shot circuit means coupled between said second comparator means and said second transistor, said one-shot circuit means for providing a short pulse to said second transistor when said second comparator means indicates that said amplified output signal exceeds said threshold voltage level, said charge storage means comprises a capacitor means, and said first transistor and first current source cause the charge on said charge storage means to decrease when said first comparator means determines that said amplified output signal exceeds said desired peak voltage level, and said second storage means and said said second current source means cause the charge on said charge storage means to increase when said second comparator means determines that said amplified output signal exceeds said threshold voltage level.

5. An apparatus according to claim 4, wherein:

said third control circuit means comprises third and fourth transistors, a third current source means, and a second charge storage means, said third transistor being coupled to an output of said second comparator means of said second control circuit means, to said third current source means, to said second charge storage means, and to said fourth transistor, and said fourth transistor being coupled to said first charge storage means and said second current source means, and said third control circuit means is arranged such that said third transistor causes said second charge storage means to discharge when said second control circuit means is triggered, and said third current source means causes said second charge storage means to charge up at a predetermined rate so as to turn on said fourth transistor after said predetermined length of time if said second control circuit means has not triggered and caused said third transistor to discharge said second charge storage means.

6. An apparatus according to claim 5, wherein:

said incoming data signal is a differential signal, said amplified output signal is a differential amplified output signal, said first control circuit means is coupled a first line of said amplified output signal, and said second control circuit means is coupled to a second line of said amplified output signal.

7. An apparatus according to claim 1, wherein:

said charge storage means comprises a capacitor means.

8. An apparatus according to claim 1, wherein:

said threshold voltage level is approximately one-half said desired peak voltage level.

9. An apparatus according to claim 1, wherein:

said third control circuit means comprises first and second transistors, a current source means, and a second charge storage means, said first transistor being coupled to said second control circuit means, to said current source means, to said second charge storage means, and to said second transistor, and said second transistor being coupled to said first charge storage means.

10. An apparatus according to claim 9, wherein:

said third control circuit means is arranged such that said first transistor causes said second charge storage means to discharge when said second control circuit means is triggered, and said current source means causes said second charge storage means to charge up at a predetermined rate so as to turn on said second transistor after said predetermined length of time if said second control circuit means has not triggered and caused said first transistor to discharge said second charge storage means.

11. An apparatus according to claim 1, wherein:

said incoming data signal is a differential signal, said amplified output signal is a differential amplified output signal, said first control circuit means is coupled a first line of said amplified output signal, and said second control circuit means is coupled to a second line of said amplified output signal.

12. A data independent automatic gain control apparatus which amplifies an incoming data signal and provides an amplified output signal, comprising:

a) a first amplifier means with an adjustable gain and having a data input which receives said incoming data signal, a control input which controls said adjustable gain of said first amplifier means, and a data output;

b) charge storage means coupled to said control input of said first amplifier means for supplying a control voltage to said control input;

c) a first control circuit means coupled to said data output of said first amplifier means and to said charge storage means, said first control circuit means for changing the charge on said charge storage means in a first direction when a voltage of said amplified output signal exceeds a desired peak voltage level; and d) a second control circuit means coupled to said data output of said first amplifier means and to said charge storage means, said second control circuit means for changing the charge on said charge storage means in a second direction when said voltage of said amplified output signal exceeds a predetermined threshold voltage level, said predetermined threshold voltage level being set lower than said desired peak voltage level and higher than ground, wherein said first control circuit means includes a first comparator means which compares said amplified output signal and said desired peak voltage level, a first transistor which is coupled to said first comparator means and to said charge storage means, and a first current source means coupled to said first transistor, wherein said first transistor and said first current source means cause the charge on said charge storage means to change in said first direction when said first comparator means determines that said amplified output signal exceeds said desired peak voltage level, and wherein said voltage of said amplified output signal of said automatic gain control apparatus is substantially independent of the values of said incoming data signal.

13. An apparatus according to claim 12, further comprising:

e) a third control circuit means coupled to said second control circuit means and to said charge storage means, said third control circuit means for changing the charge on said charge storage means in said second direction when said voltage of said amplified output signal falls below said threshold voltage level for a predetermined length of time.

14. An apparatus according to claim 13, further comprising:

a second amplifier means having fixed gain, said second amplifier means having a data input which receives said data output of said first amplifier means, and an output which relates to said amplified output signal, wherein said first control circuit means and said second control circuit means are coupled to said data output of said first amplifier means via said second amplifier means.

15. An apparatus according to claim 12, wherein:

said second control circuit means comprises a second comparator means which compares said amplified output signal and said threshold voltage level, a second transistor which is coupled to said second comparator means and to said charge storage means, and a second current source means coupled to said second transistor, wherein said second transistor and second current source means cause the charge on said charge storage means to change in said second direction when said second comparator means determines that said amplified output signal exceeds said threshold voltage level.

16. An apparatus according to claim 15, wherein:

said second control circuit means further comprises a one-shot circuit means coupled between said second comparator means and said second transistor, said one-shot circuit means for providing a short pulse to said second transistor when said second comparator means indicates that said amplified output signal exceeds said threshold voltage level.

17. An apparatus according to claim 15, wherein:

said third control circuit means comprises third and fourth transistors, a third current source means, and a second charge storage means, said third transistor being coupled to an output of said second comparator means of said second control circuit means, to said third current source means, to said second charge storage means, and to said fourth transistor, and said fourth transistor being coupled to said first charge storage means and said second current source means.

18. An apparatus according to claim 17, wherein:

said third control circuit means is arranged such that said third transistor causes said second charge storage means to discharge when said second control circuit means is triggered, and said third current source means causes said second charge storage means to charge up at a predetermined rate so as to turn on said fourth transistor after said predetermined length of time if said second control circuit means has not triggered and caused said third transistor to discharge said second charge storage means.

19. A data independent automatic gain control apparatus which amplifies an incoming data signal and provides an amplified output signal, comprising:
   a) a first amplifier means with an adjustable gain and having a data input which receives said incoming data signal, a control input which controls said adjustable gain of said first amplifier means, and a data output;
   b) charge storage means coupled to said control input of said first amplifier means for supplying a control voltage to said control input;
   c) a first control circuit means coupled to said data output of said first amplifier means and to said charge storage means, said first control circuit means for changing the charge on said charge storage means in a first direction when a voltage of said amplified output signal exceeds a desired peak voltage level; and
   d) a second control circuit means coupled to said data output of said first amplifier means and to said charge storage means, said second control circuit means for changing the charge on said charge storage means in a second direction when said voltage of said amplified output signal exceeds a predetermined threshold voltage level, said predetermined threshold voltage level being set lower than said desired peak voltage level and higher than ground, wherein
   said second control circuit means comprises a comparator means which compares said amplified output signal and said threshold voltage level, a transistor which is coupled to said comparator and to said charge storage means, and a current source means coupled to said transistor, wherein said transistor and current source means cause the charge on said charge storage means to change in said second direction when said comparator means determines that said amplified output signal exceeds said threshold voltage level, and wherein
   said voltage of said amplified output signal of said automatic gain control apparatus is substantially independent of the values of said incoming data signal.

20. An apparatus according to claim 19, wherein:
   said second control circuit means further comprises a one-shot circuit means coupled between said comparator means and said transistor, said one-shot circuit means for providing a short pulse to said transistor when said comparator means indicates that said amplified output signal exceeds said threshold voltage level.

21. An apparatus according to claim 20, wherein:
   said threshold voltage level is approximately one-half said desired peak voltage level.

* * * * *